(12) United States Patent
Qin et al.

(10) Patent No.: US 7,928,745 B2
(45) Date of Patent: Apr. 19, 2011

(54) ENDURANCE TESTING SYSTEM AND METHOD

(75) Inventors: Qiang Qin, Shenzhen (CN); Tian-You Liu, Shenzhen (CN); Lian-Zhong Gong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 333 days.

(21) Appl. No.: 12/331,445

(22) Filed: Dec. 10, 2008

(65) Prior Publication Data

US 2010/0117639 A1 May 13, 2010

(30) Foreign Application Priority Data

Nov. 12, 2008 (CN) .......................... 2008 1 0305506

(51) Int. Cl.
*G01R 31/00* (2006.01)

(52) U.S. Cl. ................................. 324/750.02; 324/537

(58) Field of Classification Search ........................ None
See application file for complete search history.

(56) References Cited

U.S. PATENT DOCUMENTS

| | | | | |
|---|---|---|---|---|
| 5,261,285 A * | 11/1993 | Tokoyama | ................... | 73/865.8 |
| 5,627,463 A * | 5/1997 | Lin | .......................... | 324/750.24 |
| 6,874,350 B2 * | 4/2005 | Seo et al. | ............................ | 73/7 |
| 2004/0000999 A1 * | 1/2004 | Turner et al. | ................ | 340/572.4 |

* cited by examiner

*Primary Examiner* — Vinh P Nguyen
(74) *Attorney, Agent, or Firm* — Zhigang Ma

(57) ABSTRACT

An endurance testing system is configured to test endurance of a first detecting apparatus. The endurance testing system includes a second detecting apparatus, a movement module, a processor, and a storage module. The movement module includes a first inductive object and a second inductive object. The processor is connected to the first and second detecting apparatuses, and the movement module, for controlling the movement module and counting a first number of times the first detecting apparatus detects the first inductive object, and a second number of times the second detecting apparatus detects the second inductive object. The storage module is connected to the processor, for storing the first and second numbers of times from the processor. The first detecting apparatus fails the testing upon the condition that the first number of times is not equal to the second number of times.

17 Claims, 5 Drawing Sheets

ENDURANCE TESTING SYSTEM AND METHOD

BACKGROUND

1. Technical Field

Embodiments of the present disclosure relate to testing systems and testing methods and, more particularly, to an endurance testing system and an endurance testing method.

2. Description of the Related Art

Metal detecting apparatuses are widely used to detect metals. Before use, the metal detecting apparatuses generally need to be tested for their service life or their endurance. Testings are usually performed either manually or using testing devices which include many costly chips. Manual testing is time-consuming and error-prone, and using a testing device to do the testing is often expensive.

Therefore, what is needed, is an endurance testing system and an endurance testing method which can solve the above problems.

DETAILED DESCRIPTION

Figure 1:
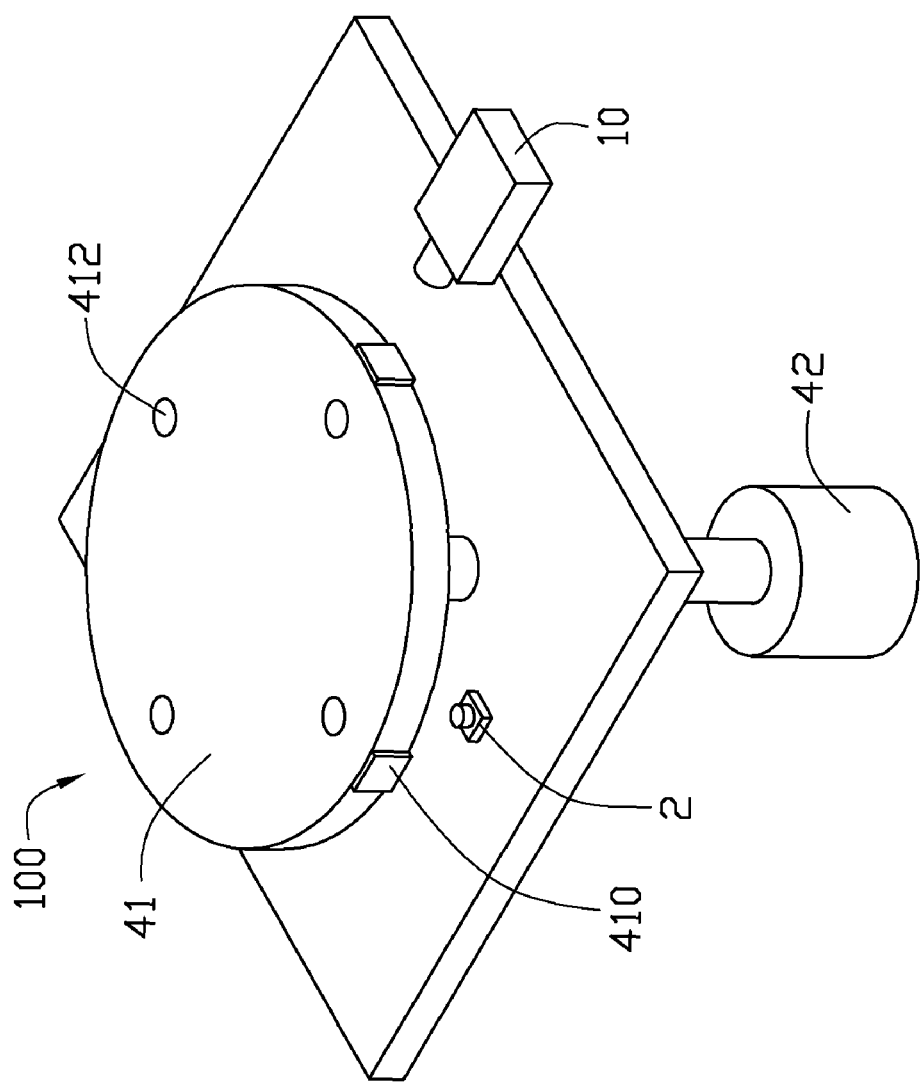
FIG. 1 is a schematic view of one embodiment of an endurance testing system of the present disclosure.
Figure 2:
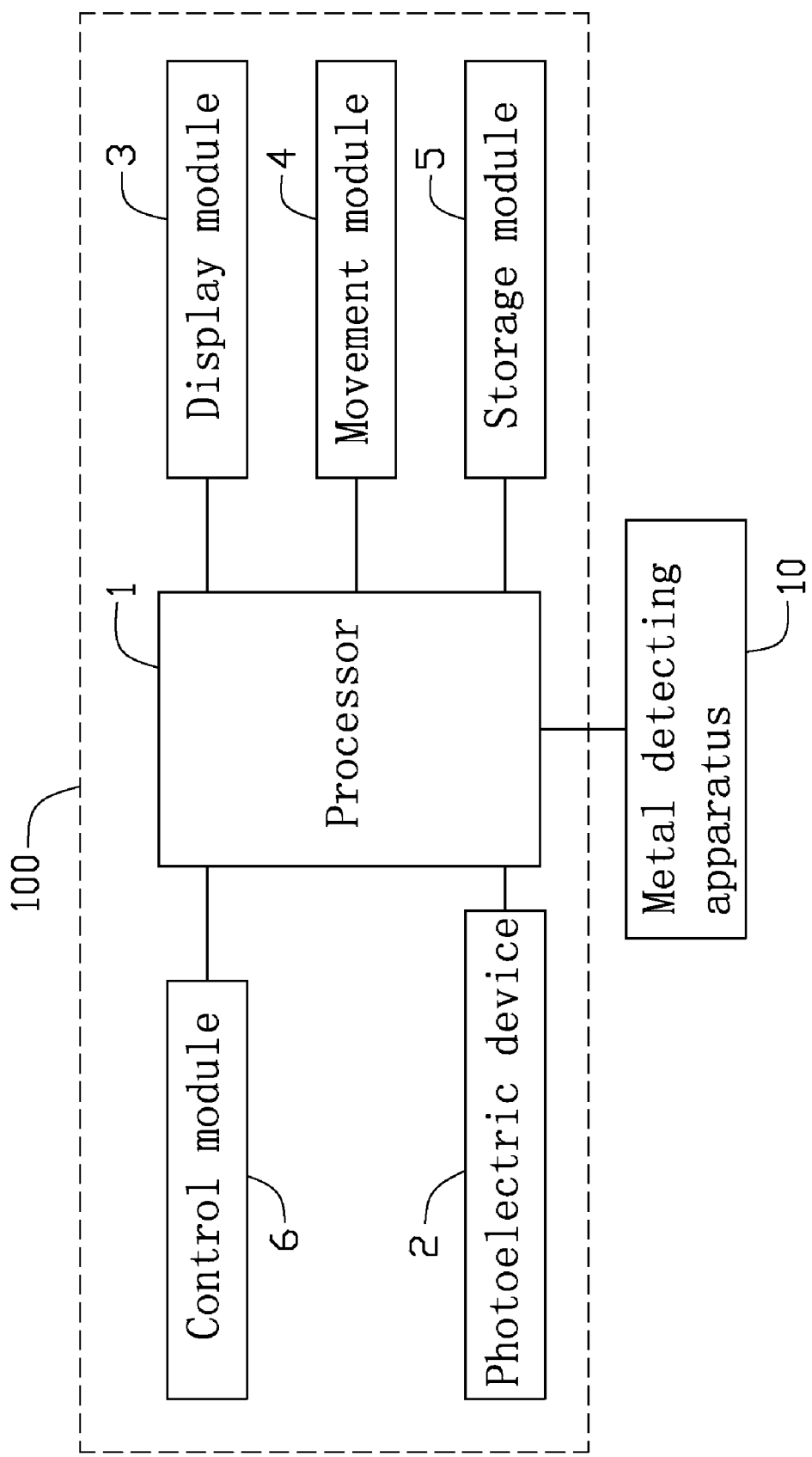
FIG. 2 is a block diagram of the testing system of FIG. 1.

Referring to FIGS. 1 and 2, one embodiment of an endurance testing system 100 is configured to test endurance of a metal detecting apparatus 10. The endurance testing system 100 includes a processor 1, a photoelectric device 2, a display module 3, a movement module 4, a storage module 5, and a control module 6.

The movement module 4 includes a turntable 41, and a motor 42 with an output connected to the turntable 41. At least one first inductive object and at least one second inductive object are mounted to the turntable 41. The number of the at least one first inductive object is equal to the number of the at least one second inductive object. In the illustrated embodiment, the at least one first inductive object includes four metal blocks 410 mounted to a circumference of the turntable 41, and the at least one second inductive object includes four holes 412 defined from through an upper surface through a bottom surface of the turntable 41.

The metal detecting apparatus 10, the photoelectric device 2, the display module 3, the movement module 4, the storage module 5, and the control module 6 are all connected to the processor 1. The metal detecting apparatus 10 is arranged coplanar with the turntable 41, to detect the metal blocks 410, and the photoelectric device 2 is mounted under the turntable 41, to detect the four holes 412.

Figure 3:
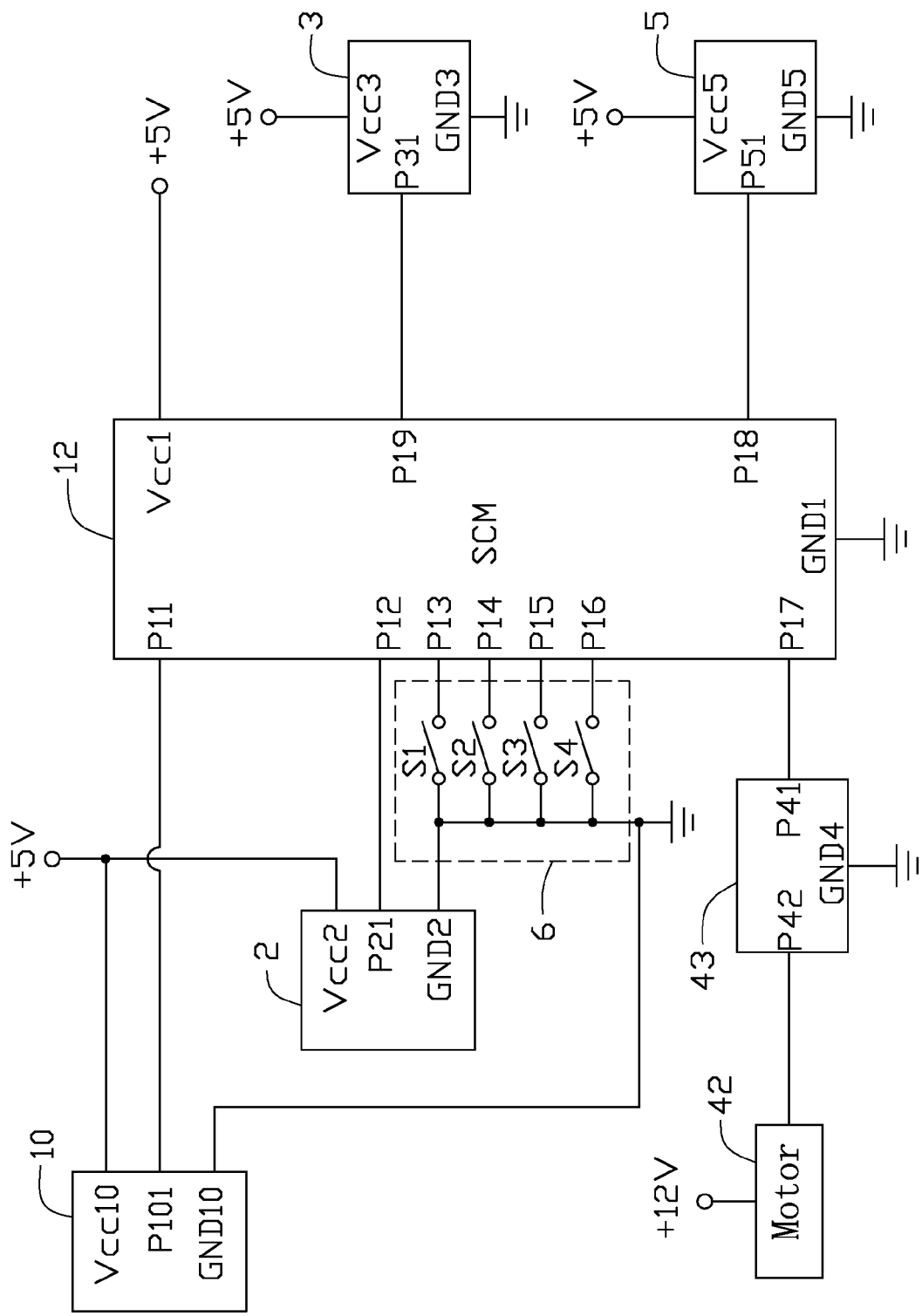
FIG. 3 is a circuit diagram of the testing system of FIG. 1.

Referring to FIG. 3, the processor 1 includes a Single Chip Micyoco (SCM) 12. The SCM 12 includes six input pins P11-P16, three output pins P17-P19, a power pin Vcc1, and a ground pin GND1. The photoelectric device 2 includes an output pin P21, a ground pin GND2, and a power pin Vcc2. The display module 3 includes an input pin P31, a power pin Vcc3, and a ground pin GND3. The movement module 4 further includes a drive chip 43. The drive chip 43 includes an input pin P41, an output pin P42, and a ground pin GND4. The storage module 5 includes an input pin P51, a power pin Vcc5, and a ground pin GND5. The control module 6 includes a start switch S1, a reset switch S2, a plus switch S3, and a minus switch S4. The metal detecting apparatus 10 includes an output pin P101, a ground pin GND10, and a power pin Vcc10.

The input pin P11 of the SCM 12 is connected to the output pin P101 of the metal detecting apparatus 10. The input pin P12 of the SCM 12 is connected to the output pin P21 of the photoelectric device 2. The input pin P13 is connected to a first terminal of the start switch S1. The input pin P14 is connected to a first terminal of the reset switch S2. The input pin P15 is connected to a first terminal of the plus switch S3. The input pin P16 is connected to a first terminal of the minus switch S4. The output pin P17 is connected to the input pin P41 of the drive chip 43. The output pin P18 is connected to the input pin P51 of the storage module 5. The output pin P19 is connected to the input pin P31 of the display module 3. Second terminals of the start switch S1, the reset switch S2, the plus switch S3, and the minus switch S4 are connected to the ground pin GND2 of the photoelectric device 2. The output pin P42 of the drive chip 43 is connected to the motor 42. The power pin Vcc1 of the SCM 12, the power pin Vcc2 of the photoelectric device 2, the power pin Vcc3 of the display module 3, the power pin Vcc5 of the storage module 5, and the power pin Vcc10 of the metal detecting apparatus 10 are connected to a 5V power source. The ground pin GND1 of the SCM 12, the ground pin GND2 of the photoelectric device 2, the ground pin GND3 of the display module 3, the ground pin GND4 of the drive chip 43, the ground pin GND5 of the storage module 5, and the ground pin GND10 of the metal detecting apparatus 10 are all grounded. The motor 42 is further connected to a 12V power source. In one embodiment, the SCM 12 may be an ATMEL8515 SCM. The display module 3 may be a JHD162G liquid crystal display. The drive chip 43 may be a ULN2803 drive chip. The storage module 5 may be an AT93C46 storage chip.

Figures 1, 4:
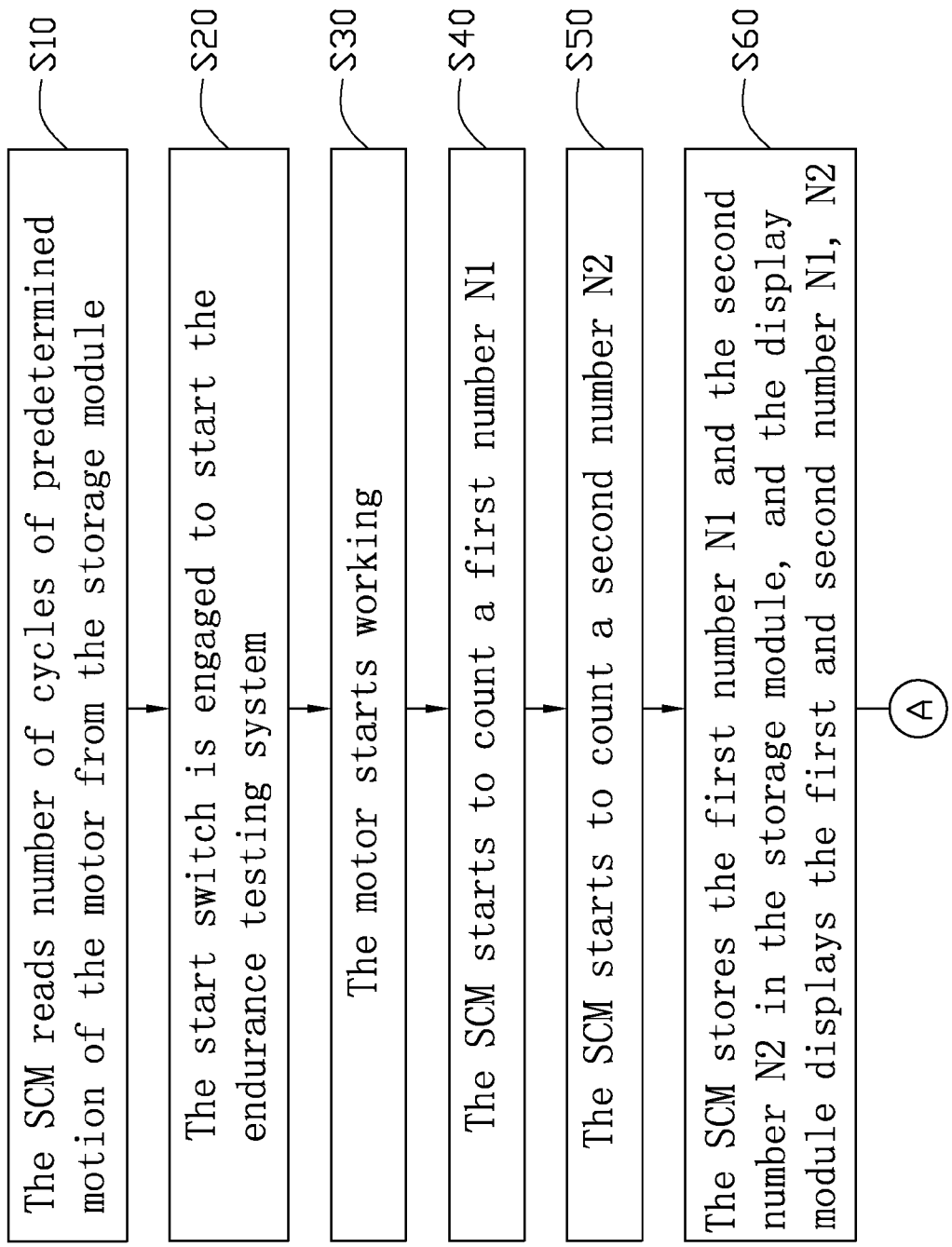
FIG. 4 is a flowchart of one embodiment of an endurance testing method of the present disclosure.
Figures 2, 4:
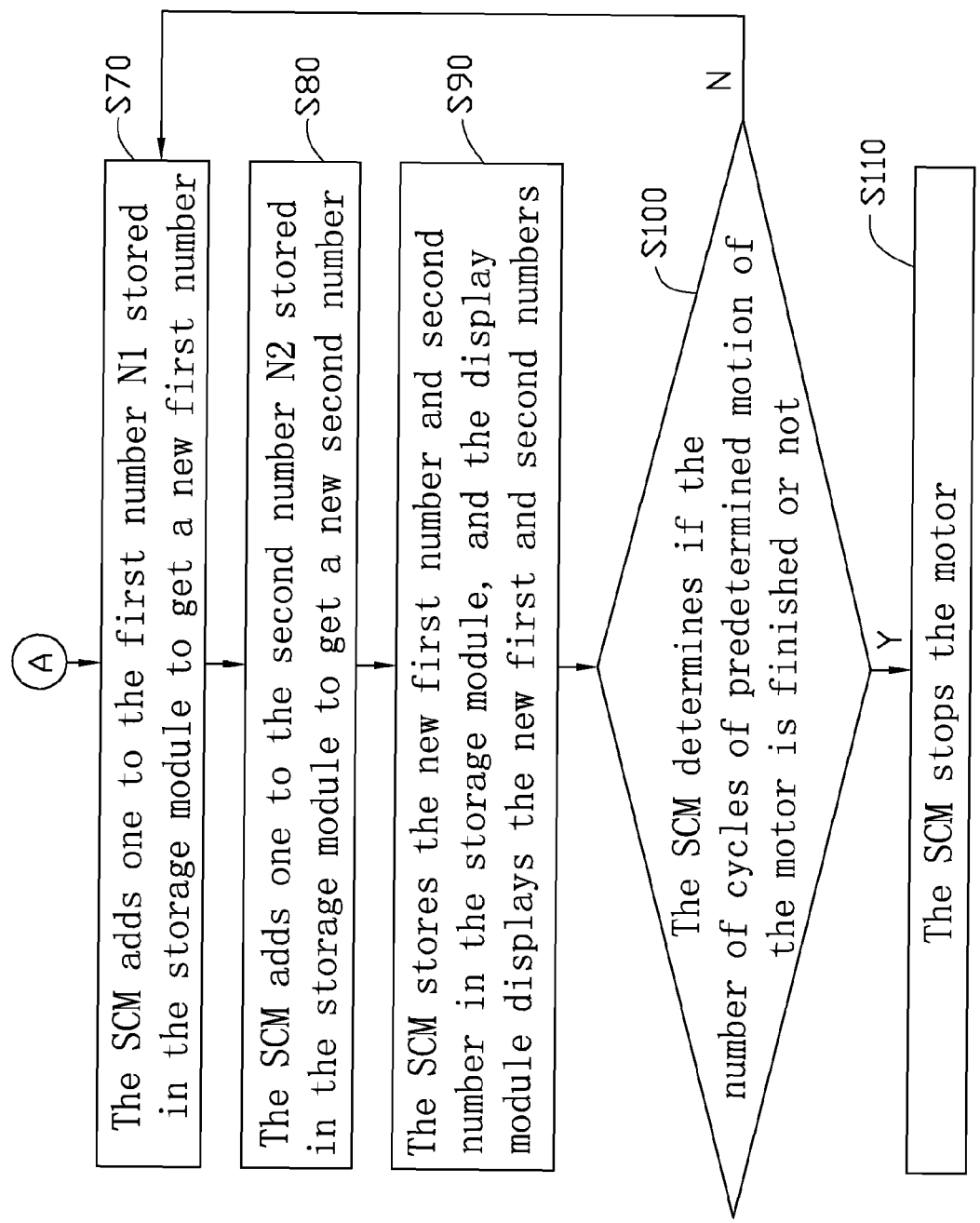

FIG. 4 is a flowchart of one embodiment of an endurance testing method which may be used the above-mentioned testing system to test endurance of the metal detecting apparatus 10.

In step S10, the SCM 12 reads a number of testing cycles of a predetermined motion of the motor 42 from the storage module 5. If the number of testing cycles stored in the storage module 5 needs to be changed, the reset switch S2 is engaged, and the number of testing cycles can be increased or decreased via using the plus switch S3 or the minus switch S4 correspondingly. After the number of testing cycles being changed, the reset switch S2 is engaged again to store the new number of testing cycles in the storage module 5.

In step S20, the start switch S1 is engaged to start the endurance test of the metal detecting apparatus 10.

In step S30, the input pin P13 of the SCM 12 receives a low level signal, such as "0", from the start switch S1. The output pin P17 of the SCM 12 outputs a high level signal, such as "1", to the drive chip 43, to drive the motor 42 to start working. As a result, the turntable 41 starts to rotate.

In step S40, when the metal detecting apparatus 10 detects one of the four metal blocks 410, the output pin P101 of the metal detecting apparatus 10 outputs a low level signal, such as "0", to the input pin P11 of the SCM 12. As a result, the SCM 12 counts the number of times N1 the metal detecting apparatus 10 detects one of the metal blocks 410.

In step S50, when the photoelectric device 2 detects one of the four holes 412, the output pin P21 outputs a low level signal, such as "0", to the input pin P12 of the SCM 12. As a result, the SCM 12 counts the number of times N2 the photoelectric device 2 detects the hole 412. In the instant endurance testing method, steps S40 and S50 may be executed simultaneously, step S40 may be executed first, or the S50 may be executed first.

In step S60, the SCM 12 stores N1 and N2 in the storage module 5 via the output pin P18, and outputs N1 and N2 to the display module 3 via the output pin P19. The display module 3 displays the N1, N2 correspondingly.

In step S70, when the metal detecting apparatus 10 detects one of the metal blocks 410 again, the output pin P101 of the metal detecting apparatus 10 outputs a low level signal, such as "0", to the input pin P11 of the SCM 12. The SCM 12 adds one to N1 stored in the storage module 5.

In step S80, when the photoelectric device 2 detects one of the holes 412 again, the output pin P21 of the photoelectric device 2 outputs a low level signal, such as "0", to the input pin P12 of the SCM 12. The SCM 12 adds one to N2 stored in the storage module 5.

In step S90, the SCM 12 outputs N1 and N2 to the display module 3 via the output pin P19. The display module 3 displays N1, N2 correspondingly.

In step S100, the SCM 12 determines if N2 is equal to the predetermined number of testing cycles of the motor 42 stored in the storage module 5. If yes, the procedure goes to step S110. If not, the procedure goes back to step S70.

In step S110, the output pin P17 of the SCM 12 outputs a low level signal, such as "0", to stop the motor 42. The display module 3 displays N1 and N2.

In the present embodiment, the photoelectric device 2 will always supply the total number of testing cycles, and if at the end of the test, N1 equals N2, the metal detecting apparatus 10 is proved to have functioned as expected. If the N1 does not equal N2, the metal detecting apparatus 10 malfunctioned.

In other embodiments, the endurance testing system 100 can be configured to test endurance of other apparatus. For example, when the metal detecting apparatus 10 is able to correctly supply the total number of testing cycles, the endurance testing system 100 can be configured to test endurance of the photoelectric device 2. If N2 equals N1, the endurance of the photoelectric device 2 is good as expected. If N2 does not equal N1, the endurance of the photoelectric device 2 malfunctioned.

The foregoing description of the various inventive embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others of ordinary skill in the art to utilize the disclosure and various embodiments and with various modifications as are suited to the particular use contemplated. Alternately embodiments will become apparent to those of ordinary skill in the art to which the present disclosure pertains without departing from its spirit and scope. Accordingly, the scope of the present disclosure is defined by the appended claims rather than the foregoing description and the various inventive embodiments described therein.

What is claimed is:

1. An endurance testing system configured to test endurance of a first detecting apparatus, the endurance testing system comprising:
    a second detecting apparatus;
    a movement module comprising a first inductive object and a second inductive object, the movement module being capable of repeatedly providing the first and the second inductive objects for the first and second detecting apparatuses to detect, respectively;
    a processor connected to the first and second detecting apparatuses, and the movement module, for controlling the movement module and counting a first number of times the first detecting apparatus detects the first inductive object, and a second number of times the second detecting apparatus detects the second inductive object; and
    a storage module connected to the processor, for storing the first and second numbers of times from the processor;
    wherein the first detecting apparatus fails the testing upon the condition that the first number of times is not equal to the second number of times.

2. The endurance testing system of claim 1, wherein a number of testing cycles of a predetermined motion of the movement module is stored in the storage module, the processor controls the movement module to stop testing in response to the number of testing cycles having been performed being equal to the number of testing cycles of the predetermined motion of the movement module.

3. The endurance testing system of claim 1, further comprising a control module, wherein the control module is connected to the processor for setting a number of testing cycles of a predetermined motion of the movement module, the movement module stops testing in response the number of testing cycles being equal to the number of the predetermined motion of the movement module.

4. The endurance testing system of claim 1, further comprising a display module, wherein the display module is connected to the processor for displaying the first and second numbers of times.

5. The endurance testing system of claim 1, wherein the processor is capable of receiving a first signal in response to the first inductive object being detected from the first detecting apparatus, and a second signal in response to the second inductive object being detected from the second detecting apparatus; wherein the processor counts the first and second numbers of times according to the first and second signals.

6. The endurance testing system of claim 1, wherein the second detecting apparatus is a photoelectric device, and the first inductive object is at least one metal block mounted to the movement module, the second inductive object is at least one hole defined in the movement module, each of the one metal block can be detected by the first detecting apparatus.

7. The endurance testing system of claim 6, wherein the movement module comprises:
    a turntable, wherein each of the at least one metal block is mounted to a circumference of the turntable, and each of the at least one hole is defined from through an upper surface through a bottom surface of the turntable;
    a motor connected to the turntable for driving the turntable to rotate; and
    a drive chip connected between the processor and the motor for driving the motor.

8. The endurance testing system of claim 1, wherein the first inductive object comprises a plurality of metal blocks mounted to the movement module, the second inductive object comprises a plurality of holes defined in the movement module, wherein a number of the plurality of metal blocks is equal to a number of the plurality of holes.

9. The endurance testing system of claim 8, wherein the movement module comprises:
    a turntable, wherein the plurality of metal blocks are mounted to a circumference of the turntable, and the plurality of holes are defined from through an upper surface through a bottom surface of the turntable;

a motor connected to the turntable for driving the turntable to rotate; and a drive chip connected between the processor and the motor for driving the motor.

10. An endurance testing system configured to test endurance of a metal detecting apparatus, the endurance testing system comprising:

a photoelectric device;

a movement module comprising:

a turntable, wherein four metal blocks are mounted a circumference of the turntable, and four holes are defined from through an upper surface through a bottom surface of the turntable;

a motor, wherein an output of the motor is connected to the turntable for driving the turntable;

a drive chip connected to the motor for driving the motor; and a processor connected to the metal detecting apparatus, the photoelectric device, and the drive chip, for controlling the motor and counting a first number of times the metal detecting apparatus detects the metal blocks, and a second number of times the photoelectric device detects the holes; and a storage module connected to the processor, for storing the first and second numbers of times from the processor;

wherein the metal detecting apparatus fails the testing upon the condition that the first number of times is not equal to the second number of times.

11. An endurance testing method configured to test endurance of a first detecting apparatus, the endurance testing method comprises:

controlling a movement module mounted with a first inductive object and a second inductive object to start working by a processor;

receiving a first signal from the first detecting apparatus via the processor in response to the first inductive object being detected by the first detecting apparatus;

receiving a second signal from a second detecting apparatus via the processor in response to the second inductive object being detected by the second detecting apparatus;

counting a first number of times in response to the processor receiving the first signal, and storing the first number of times in a storage module by the processor; and counting a second number of times in response to the processor receiving the second signal, and storing the second number of times in the storage module by the processor;

wherein the first detecting apparatus fails the testing upon the condition that the first number of times is unequal to the second number of times, and the first detecting apparatus passes the testing upon the condition that the first number of times is equal to the second number of times.

12. The endurance testing method of claim 11, wherein the second detecting apparatus is a photoelectric device, and the first detected object is a metal block mounted to the movement module, the second detected object is a hole defined in the movement module.

13. The endurance testing method of claim 11, wherein the movement module comprises:

a turntable, wherein the metal block is mounted to a circumference of the turntable, and the hole is defined in an upper surface through a bottom surface of the turntable;

a motor connected to the turntable for driving the turntable to rotate; and a drive chip connected between the processor and the motor for driving the motor.

14. The endurance testing method of claim 11, wherein the second detecting is a photoelectric device, and the first detected object includes a plurality of metal blocks mounted to the movement module, the second detected object includes a plurality of holes defined in the movement module.

15. The endurance testing method of claim 14, wherein the movement module comprises:

a turntable, wherein the plurality of metal blocks are mounted to a circumference of the turntable, and the plurality of holes are defined from through an upper surface through a bottom surface of the turntable;

a motor connected to the turntable for driving the turntable to rotate; and a drive chip connected between the processor and the motor for driving the motor.

16. The endurance testing method of claim 11, further comprising:

setting a number of testing cycles of a predetermined motion of the movement module in a control module, wherein the movement module stops working in response the number of testing cycles having being performed by the movement module being equal to the number of testing cycles of the predetermined motion.

17. The endurance testing method of claim 11, further comprising:

displaying the first and second numbers of times by a display module.

* * * * *